United States Patent
Aida et al.

(10) Patent No.: US 8,101,441 B2
(45) Date of Patent: Jan. 24, 2012

(54) METHOD OF MANUFACTURING LIGHT-EMITTING DEVICE

(75) Inventors: Kazuya Aida, Saitama-ken (JP); Hiroki Watanabe, Saitama-ken (JP); Seiji Yamaguchi, Aichi-ken (JP); Yoshinobu Suehiro, Aichi-ken (JP)

(73) Assignees: Sumita Optical Glass, Inc., Saitama-shi, Saitama-ken (JP); Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 12/656,670

(22) Filed: Feb. 12, 2010

(65) Prior Publication Data

US 2010/0203658 A1    Aug. 12, 2010

(30) Foreign Application Priority Data

Feb. 12, 2009  (JP) .................................. 2009-030360

(51) Int. Cl.
   *H01L 21/00* (2006.01)
(52) U.S. Cl. ................ 438/27; 438/28; 438/29; 438/34; 438/33; 438/107; 438/112; 438/113; 438/116; 438/126; 438/462
(58) Field of Classification Search .................. None
See application file for complete search history.

(56) References Cited

U.S. PATENT DOCUMENTS

| | | | | |
|---|---|---|---|---|
| 5,166,824 A | * | 11/1992 | Nishiguchi et al. | 359/456 |
| 7,667,223 B2 | * | 2/2010 | Suehiro et al. | 257/10 |
| 7,824,937 B2 | * | 11/2010 | Suehiro et al. | 438/26 |
| 7,887,225 B2 | * | 2/2011 | Lee et al. | 362/561 |
| 2002/0123163 A1 | * | 9/2002 | Fujii | 438/26 |
| 2004/0104111 A1 | * | 6/2004 | Ohgaki | 204/198 |
| 2004/0169466 A1 | * | 9/2004 | Suehiro et al. | 313/512 |
| 2004/0223315 A1 | * | 11/2004 | Suehiro et al. | 362/84 |
| 2004/0257797 A1 | * | 12/2004 | Suehiro et al. | 362/34 |
| 2005/0161771 A1 | * | 7/2005 | Suehiro et al. | 257/612 |
| 2006/0049421 A1 | * | 3/2006 | Suehiro et al. | 257/99 |
| 2006/0049423 A1 | * | 3/2006 | Yamaguchi et al. | 257/100 |
| 2006/0171152 A1 | * | 8/2006 | Suehiro et al. | 362/363 |
| 2006/0261364 A1 | * | 11/2006 | Suehiro et al. | 257/100 |
| 2009/0015932 A1 | * | 1/2009 | Chien | 359/642 |
| 2009/0078959 A1 | * | 3/2009 | Suehiro et al. | 257/99 |
| 2010/0203658 A1 | * | 8/2010 | Aida et al. | 438/27 |

FOREIGN PATENT DOCUMENTS

| | | | | |
|---|---|---|---|---|
| JP | 09295499 | A | * | 11/1997 |
| JP | 11-8414 | | | 1/1999 |
| JP | 11227398 | A | * | 8/1999 |
| JP | 2000000891 | A | * | 1/2000 |
| JP | 2001038808 | A | * | 2/2001 |
| JP | 2003182297 | A | * | 7/2003 |
| JP | 2003326598 | A | * | 11/2003 |
| JP | 2005-223222 | | | 8/2005 |
| JP | 2005223222 | A | * | 8/2005 |
| JP | 2007-123410 | | | 5/2007 |
| JP | 2008041844 | A | * | 2/2008 |

* cited by examiner

*Primary Examiner* — David Graybill
(74) *Attorney, Agent, or Firm* — McGinn IP Law Group, PLLC

(57) ABSTRACT

A method of manufacturing a light-emitting device includes, when sealing a light-emitting element on a mounting portion by a glass material softened by heating or when processing the glass material after the sealing, producing a concave portion partially on the glass material by partially contacting and pressing a die against an upper surface of the glass material such that a part of the upper surface being not in contact with the die is deformed and forms a curved surface.

15 Claims, 17 Drawing Sheets

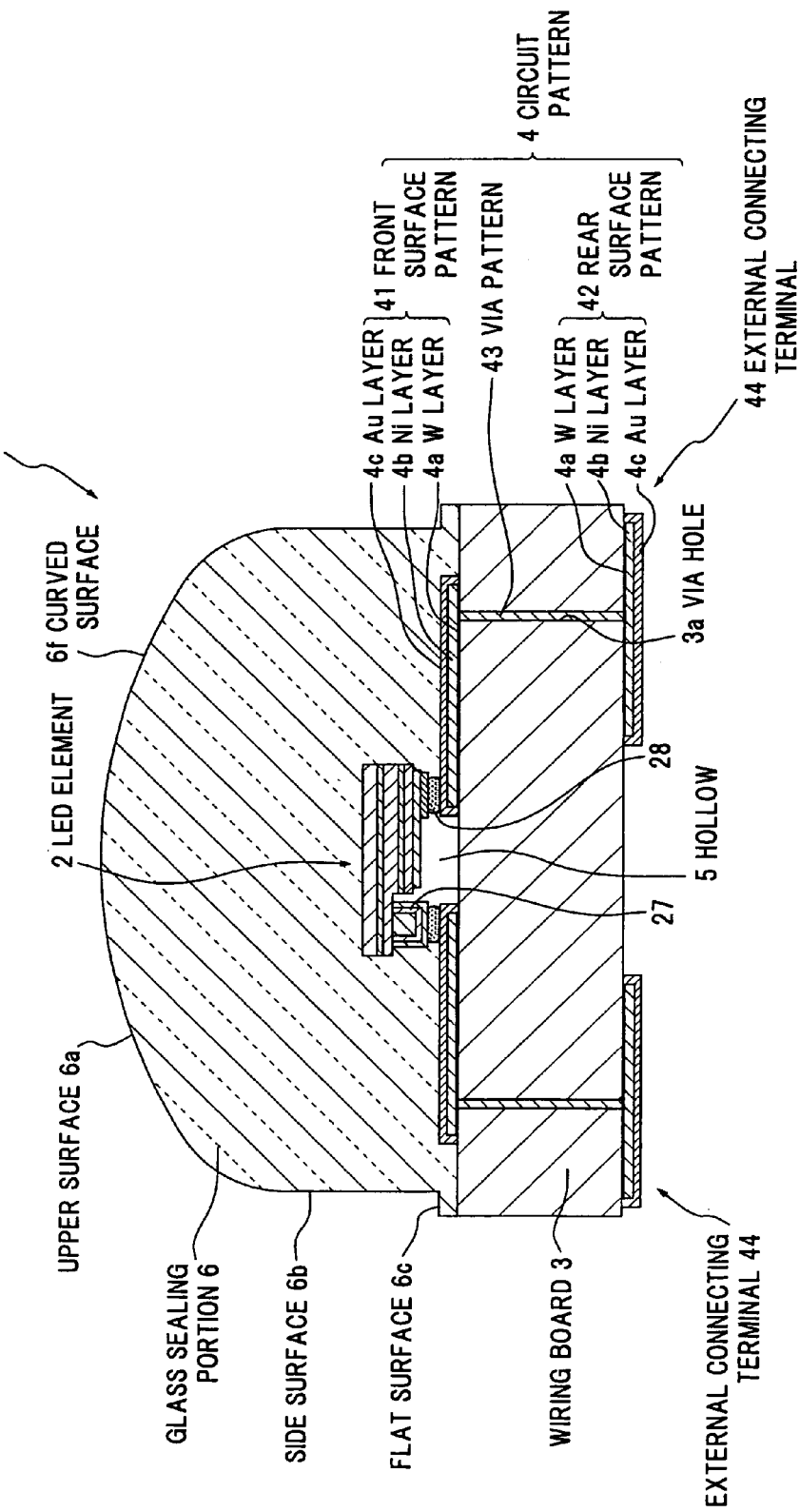

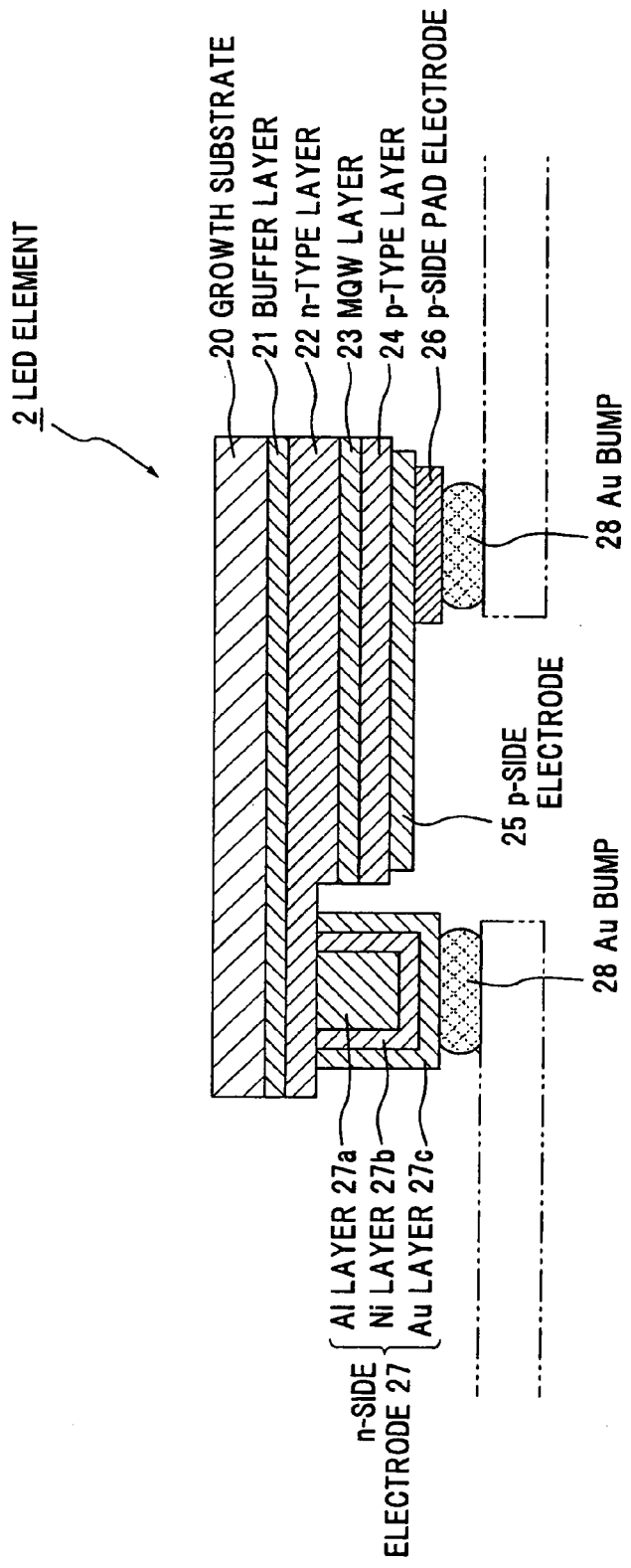

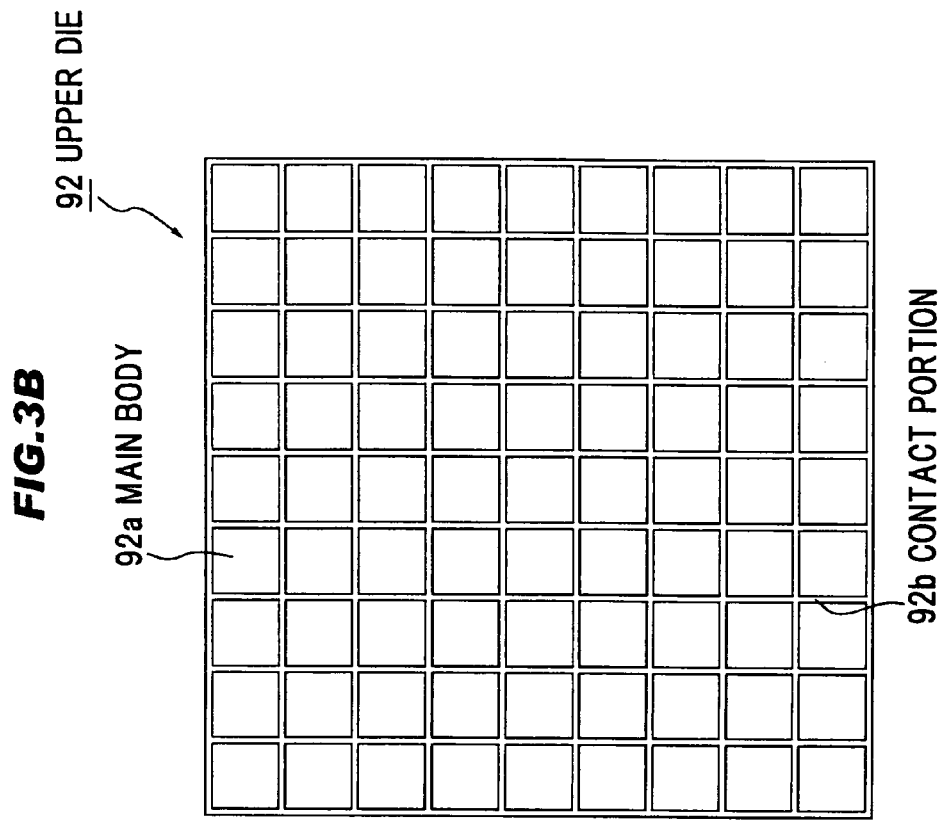
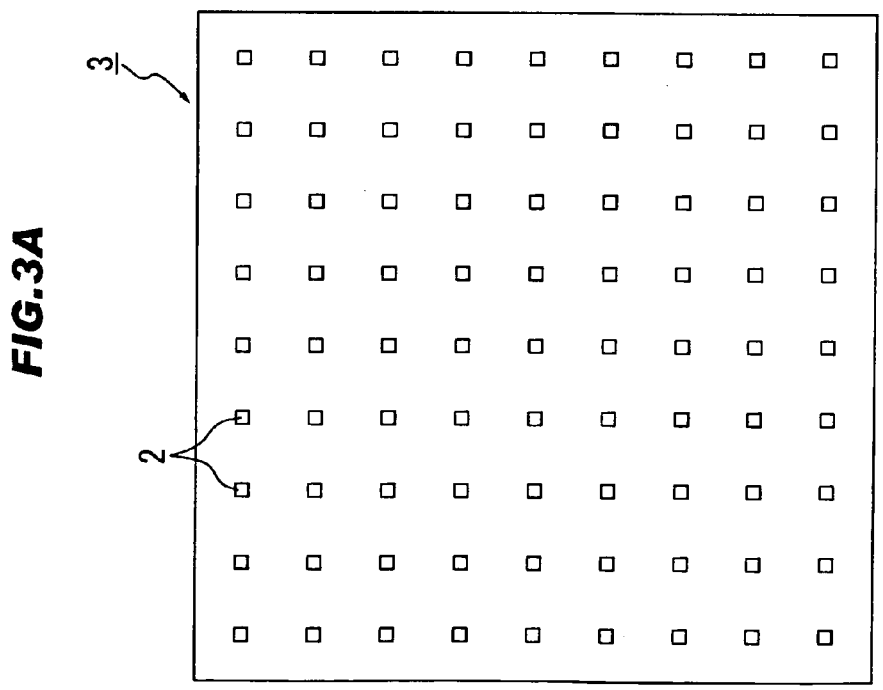

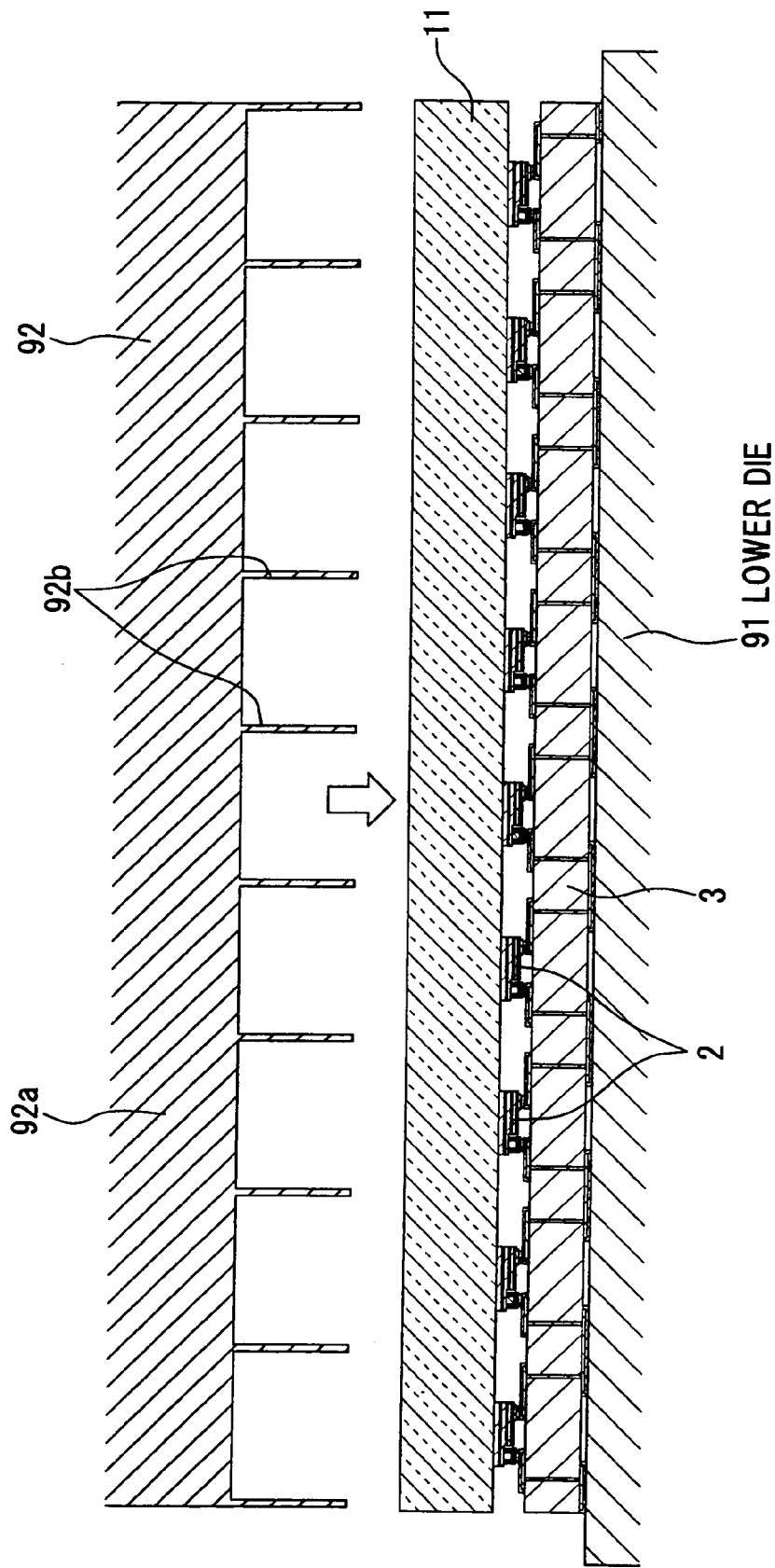

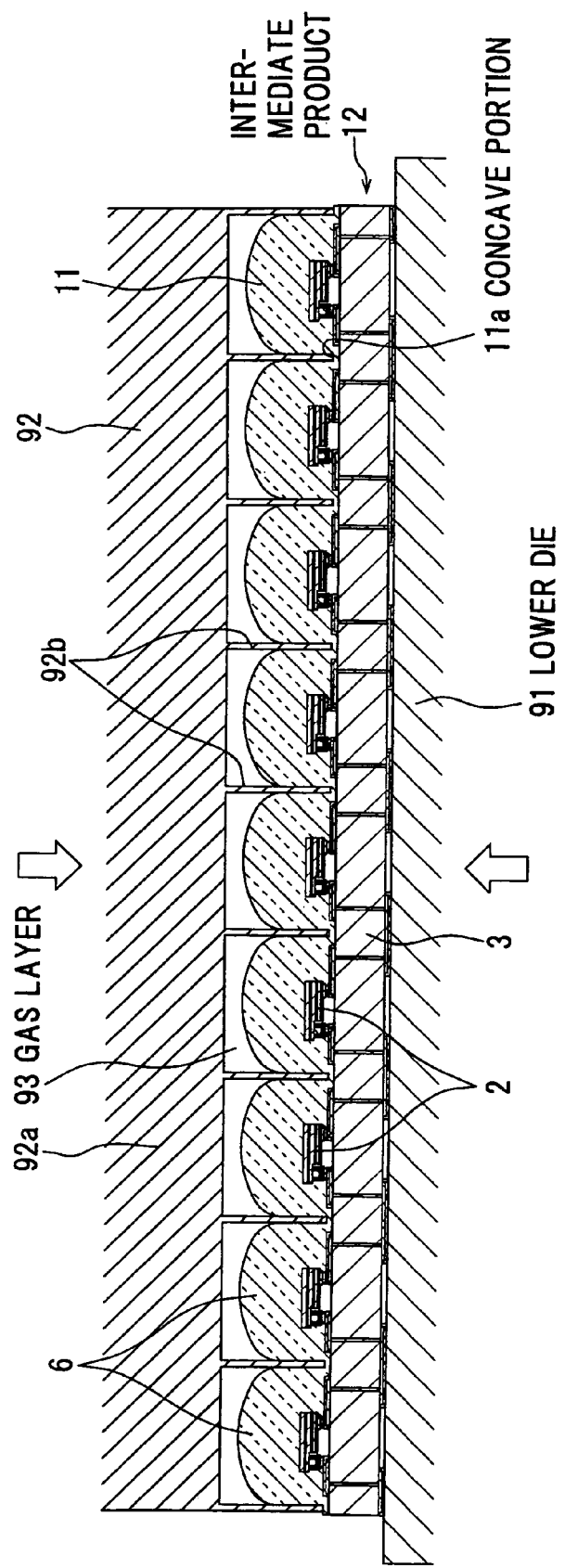

METHOD OF MANUFACTURING LIGHT-EMITTING DEVICE

The present application is based on Japanese Patent Application No. 2009-030360 filed on Feb. 12, 2009, the entire contents of which are incorporated herein by reference.

BACKGROUND OF THE INVENTION

1. Field of the Invention

The invention relates to a method of manufacturing a light-emitting device in which a light-emitting element on a mounting portion is sealed with glass by using a die.

2. Description of the Related Art

A light-emitting device is known in which a light-emitting element on a mounting portion is sealed with glass (e.g., see JP-A 2005-223222). The light-emitting device described in JP-A 2005-223222 has a flip-chip-type LED element formed of a GaN-based semiconductor compound, a substrate having a wiring layer electrically connected to the LED element, and a glass sealing portion which seals the LED element and is adhered to a surface of the substrate. The glass sealing portion is formed in a dome shape and an upper surface thereof has a curved surface.

In the meantime, when press-molding is performed by using a die which adheres firmly to the upper surface of the glass sealing portion for manufacturing the light-emitting device described in JP-A 2005-223222, there is a possibility that the glass material adheres to the die when the die is separated from the glass material and the shape of the upper surface of the glass sealing portion is thereby deformed with respect to the desired shape. In addition, if a gas is produced from the glass or the substrate, etc., during the molding, the gas enters between the die and the glass material, and thus, it is also not possible to accurately mold the upper surface of the glass sealing portion.

SUMMARY OF THE INVENTION

The invention is made in view of the above-mentioned circumstances, and it is an object of the invention to provide a method of manufacturing a light-emitting device by which a grass material does not adhere to a die or deformation with respect to the desired shape caused by a gas produced during the sealing is not generated in a curved surface of the glass material.

(1) According to one embodiment, a method of manufacturing a light-emitting device comprises:

when sealing a light-emitting element on a mounting portion by a glass material softened by heating or when processing the glass material after the sealing, producing a concave portion partially on the glass material by partially contacting and pressing a die against an upper surface of the glass material such that a part of the upper surface being not in contact with the die is deformed and forms a curved surface.

In the above embodiment (1), the following modifications and changes can be made.

(i) The die is not in contact with a portion of the upper surface of the glass material directly above the light-emitting element, and is in contact with a periphery of the portion of the upper surface directly above the light-emitting element.

(ii) The curved surface is formed on the portion of the upper surface of the glass material directly above the light-emitting element.

(iii) A plurality of the light-emitting elements are mounted on the mounting portion, and the die contacts the upper surface of the glass material at a middle part between the two adjacent light-emitting elements.

(iv) After the glass material with the curved surface formed thereon is hardened, a dicing blade enters into the concave portion of the glass material for dividing the glass material and the mounting portion.

(v) The die comprises a lattice contact portion for contacting the glass material.

Points of the Invention

According to one embodiment of the invention, a manufacturing method for a light-emitting device is conducted such that an upper surface of a glass sealing portion is formed so as not to contact an upper die to prevent deformation off from a desired shape caused by the glass material adhered to the upper die in the surface shape of the upper surface. Furthermore, a gas layer is formed between the upper surface and the upper die, so that gas generated from the glass material etc. during the sealing can be diffused into the gas layer. Thus, unlike the case that the upper surface tightly contacts the upper die, deformation off from the desired shape, which is caused by gas entering between the upper surface and the upper die, can be prevented in the surface shape of the upper surface. Therefore, the upper surface of the glass sealing portion can be formed into a desired shape to provide desired optical characteristics. In addition, the upper surface of the glass sealing portion has a curved surface convex upwards, so that light extraction efficiency is improved as compared to the case of having a flat surface.

BRIEF DESCRIPTION OF THE DRAWINGS

Next, the present invention will be explained in more detail in conjunction with appended drawings, wherein:

FIG. 1 is a schematic vertical cross sectional view showing a light-emitting device in a preferred embodiment of the present invention;

FIG. 2 is a vertical cross-sectional pattern diagram showing a LED element;

FIGS. 3A and 3B are explanatory views showing a method of manufacturing the light-emitting device, wherein FIG. 3A is a plan view showing a wiring board having light-emitting elements mounted thereon, and FIG. 3B is a bottom view of an upper die;

FIG. 4A is an explanatory pattern diagram showing a state before a sealing process of a glass material;

FIG. 4B is an explanatory pattern diagram showing a state during the sealing process of the glass material;

FIG. 16 are explanatory views showing a method of manufacturing the light-emitting device in the modification, wherein

FIGS. 18A-C are explanatory views showing a processed state of an pre-sealing glass, wherein FIG. 18A shows a processing unit for producing the pre-sealing glass from glass powder, FIG. 18B shows the pre-sealing glass produced from the glass powder, and FIG. 18C shows a state that the obtained pre-sealing glass is sliced.

DESCRIPTION OF THE PREFERRED EMBODIMENTS

Figure 5:
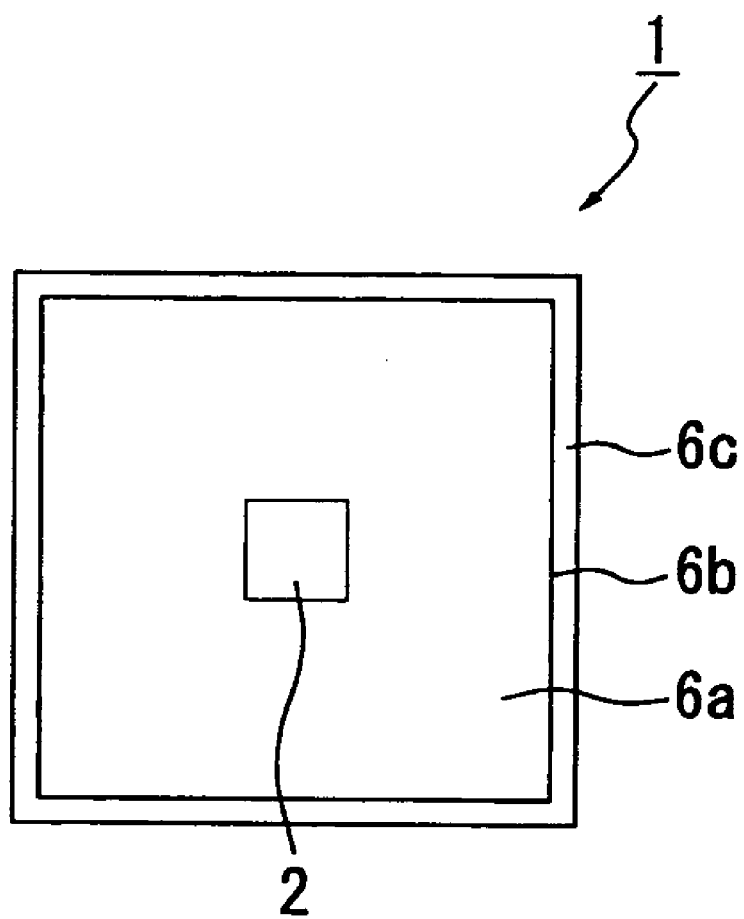
FIG. 5 is a plan view showing a light-emitting device.

FIGS. 1 to 5 show the embodiment of the invention. FIG. 1 is a schematic vertical cross sectional view showing a light-emitting device and FIG. 2 is a vertical cross-sectional pattern diagram showing a LED element.

As shown in FIG. 1, a light-emitting device 1 has a flip-chip-type LED element 2 formed of a GaN-based semiconductor material, a wiring board 3 for mounting the LED element 2, a circuit pattern 4 formed on the wiring board 3 and composed of tungsten (W)-nickel (Ni)-gold (Au), and a glass sealing portion 6 which seals the LED element 2 and is adhered to the wiring board 3. In addition, a hollow (or a gap) 5, to where glass does not enter, is formed between the LED element 2 and the wiring board 3. In the present embodiment, the wiring board 3 and the circuit pattern 4 compose a mounting portion for mounting the LED element 2 and supplying power to the LED element 2.

As shown in FIG. 2, a buffer layer 21, an n-type layer 22, a MQW layer 23 and a p-type layer 24 are formed in the LED element 2 as a light-emitting element in this order by epitaxially growing a Group III nitride-based semiconductor on a surface of a growth substrate 20 which is formed of sapphire ($Al_2O_3$). The LED element 2 is epitaxially grown at 700° C. or more, has a heat resistance temperature of 600° C. or more, and is stable at the processing temperature during the sealing process using the below-described low-melting point thermal fusion glass. In addition, the LED element 2 has a p-side electrode 25 provided on a surface of the p-type layer 24, a p-side pad electrode 26 formed on the p-side electrode 25 and an n-side electrode 27 formed on the n-type layer 22 which is exposed by partially etching from the p-type layer 24 to the n-type layer 22. An Au bump 28 is each formed on the p-side pad electrode 26 and on the n-side electrode 27.

The p-side electrode 25 is formed of, e.g., rhodium (Rh), and functions as a light reflection layer for reflecting the light emitted from the MQW layer 23 as a light emitting layer toward a direction of the growth substrate 20. It should be noted that it is possible to appropriately change the material of the p-side electrode 25. In the present embodiment, two p-side pad electrodes 26 are formed on the p-side electrode 25 and the Au bump 28 is formed on each p-side pad electrode 26. Alternatively, there may be, e.g., three p-side pad electrodes 26, and the number of the p-side pad electrodes 26 formed on the p-side electrode 25 can be appropriately changed.

The n-side electrode 27 has a contact layer and a pad layer formed in the same area. As shown in FIG. 2, the n-side electrode 27 is composed of an Al layer 27a, a thin film Ni layer 27b covering a surface of the Al layer 27a and an Au layer 27c covering a surface of the Ni layer 27b. It should be noted that it is possible to appropriately change the material of the n-side electrode 27. In the present embodiment, in a planar view, the n-side electrode 27 is formed at a corner of the LED element 2 and the p-side electrode 25 is formed on the substantially whole surface except a formation region of the n-side electrode 27.

The LED element 2 is formed 100 μm thick in 346 μm square, and a thermal expansion coefficient thereof is $7 \times 10^{-6}$/° C. Here, the thermal expansion coefficient of a GaN layer of the LED element 2 is $5 \times 10^{-6}$/° C., however, since the thermal expansion coefficient of the growth substrate 20 formed of sapphire which is the majority component is $7 \times 10^{-6}$/° C., the thermal expansion coefficient of the main body of the LED element 2 is equivalent to that of the growth substrate 20. Each part is shown in a size different from the actual size in each figure for clarifying the structure of each part of the LED element 2.

The wiring board 3 as a mounting portion is formed of a polycrystalline sintered material of alumina ($Al_2O_3$), is formed 0.25 mm thick in 1.0 mm square, and has a thermal expansion coefficient α of $7 \times 10^{-6}$/° C. As shown in FIG. 1, the circuit pattern 4 of the wiring board 3 has a front surface pattern 41 formed on a surface of the substrate and electrically connected to the LED element 2, and a rear surface pattern 42 formed on a rear surface of the substrate and being connectable to an external terminal. The front surface pattern 41 contains a W layer 4a which is patterned corresponding to an electrode shape of the LED element 2, a thin film Ni layer 4b covering a surface of the W layer 4a and a thin film Au layer 4c covering a surface of the Ni layer 4b. The rear surface pattern 42 contains a W layer 4a which is patterned corresponding to the below-described external connecting terminal 44, a thin film Ni layer 4b covering a surface of the W layer 4a and a thin film Au layer 4c covering a surface of the Ni layer 4b. The front surface pattern 41 and the rear surface pattern 42 are electrically connected by a via pattern 43 which is provided in a via hole 3a penetrating the wiring board 3 in a thickness direction and is formed of W. The external connecting terminal 44 is provided one each on an anode side and on a cathode side. Each external connecting terminal 44 is arranged at the opposing corner of the wiring board 3 in a planar view.

The glass sealing portion 6 is formed of $ZnO-B_2O_3-SiO_2-Nb_2O_5-Na_2O-Li_2O$-based thermal fusion glass. It should be noted that the glass composition is not limited thereto, for example, the thermal fusion glass may not contain $Li_2O$ or may contain $ZrO_2$ or $TiO_2$, etc., as an arbitrary component. The thermal fusion glass has a glass transition temperature (Tg) of 490° C. and a yielding point (At) of 520° C., and the glass transition temperature (Tg) is sufficiently lower than the temperature for forming an epitaxial growth layer of the LED element 2. In the present embodiment, the glass transition temperature (Tg) is 200° C. or more lower than the temperature for forming the epitaxial growth layer. In addition, the thermal expansion coefficient (α) of the thermal fusion glass at 100-300° C. is $6 \times 10^{-7}$/° C. The numerical value of the thermal expansion coefficient (α) becomes larger than the above when exceeding the glass transition temperature (Tg). As a result, the thermal fusion glass is adhered to the wiring board 3 at about 600° C. and a hot pressing process is thereby possible. In addition, a refractive index of the thermal fusion glass of the glass sealing portion 6 is 1.7.

In addition, the composition of the thermal fusion glass is arbitrary as long as the glass transition temperature (Tg) is lower than the heat resistance temperature of the LED element 2 and the thermal expansion coefficient ($\alpha$) is equivalent to that of the wiring board 3. Glass having relatively low glass transition temperature and relatively small thermal expansion coefficient includes, e.g., $ZnO$—$SiO_2$—$R_2O$-based glass (R is at least one selected from Group I elements such as Li, Na and K), phosphoric acid-based glass and lead glass. Among these glasses, the $ZnO$—$SiO_2$—$R_2O$-based glass is good in moisture resistance as compared to the phosphoric acid-based glass, and is suitable since the environmental problem does not occur, unlike the lead glass.

Here, the thermal fusion glass is glass formed as a softened state by heat, which is different from glass formed by sol-gel method. Since volume variation during the formation is large in the sol-gel glass, cracks are likely to be generated and it is thereby difficult to form a thick film by the glass, however, it is possible to avoid this problem in the thermal fusion glass. In addition, airtightness may be lost due to generation of micropores in the sol-gel glass, however, such a problem does not occur in the thermal fusion glass and it is possible to accurately seal the LED element 2.

In addition, the thermal fusion glass is processed at an incomparably higher viscosity than a viscosity level which is generally regarded as a high viscosity in resins. Furthermore, in the case of glass, even when the temperature exceeds the yield point by several tens of degrees, the viscosity is not lowered to the level of the general resin sealing. In addition in order to have the viscosity level during the general resin formation, a temperature above the crystal growth temperature of the LED element is required, or adhesion to the die occurs, and the sealing/forming process becomes difficult. Thus, processing at $10^4$ poises or more is preferred.

As shown in FIG. 1, the glass sealing portion 6 entirely covers the LED element 2 and the wiring board 3, and has a maximum thickness of 0.5 mm. The glass sealing portion 6 has an upper surface 6a forming an upwardly convex curved surface 6f, a side surface 6b extending downwardly from an outer edge of the upper surface 6a and being vertical to the wiring board 3, and a flat surface 6c parallel to the wiring board 3 extending from a lower edge of the side surface 6b.

The light-emitting device 1 configured as described above is manufactured through the following processes.

Firstly, glass component oxide powder is heated to 1200° C. and is stirred in a molten state. Then, after the glass is solidified, it is processed into a plate shape by slicing so as to correspond to a thickness of the glass sealing portion 6 (plate shape forming process).

On the other hand, the wiring board 3 having the via hole 3a formed therein is prepared and a W paste is screen printed on the surface of the wiring board 3 according to the circuit pattern. Next, the W paste printed wiring board 3 is heat treated at a temperature above 1000° C. to bake W to the wiring board 3, and the Ni plating and Au plating are provided on W to form the circuit pattern 4 (pattern forming process).

In the present embodiment, in the wiring board 3, the circuit pattern 4 is formed after baking ceramic. This is because, if the baking is performed after forming the circuit pattern 4 on the non-baked ceramic (e.g., a green sheet), the accuracy of the circuit pattern 4 is deteriorated due to thermal expansion and contraction caused by heating and cooling during and after the baking.

The circuit pattern 4 may be formed on the baked ceramic by depositing metal such as Cr or Ti or by etching into a predetermined shape after bonding a Cu foil, instead of printing the W paste and heat treating, followed by Ni-plating and Au plating.

FIG. 3 are explanatory views showing a method of manufacturing the light-emitting device, wherein FIG. 3A is a plan view showing a wiring board having light-emitting elements mounted thereon, and FIG. 3B is a bottom view of an upper die.

As shown in FIG. 3, plural LED elements 2 are mounted on the wiring board 3 at equal intervals vertically and horizontally (element mounting process). In details, the plural LED elements 2 are electrically connected to the front surface pattern 41 of the circuit pattern 4 of the wiring board 3 by each Au bump 28. In the present embodiment, three bump connections are provided in total, two of which are on a p-side and one is on an n-side.

Then, the wiring board 3 having LED elements 2 each mounted thereon is set on a lower die 91, and a plate-like pre-sealing glass 11 (not shown in FIG. 3) is set on an upper die 92. A heater is each arranged in the lower die 91 and the upper die 92, and each temperature of the lower die 91 and the upper die 92 is adjusted independently. As shown in FIG. 3B, the upper die 92 has a main body 92a formed in a plate shape and not in contact with the pre-sealing glass 11, and a contact portion 92b formed on an underside of the main body 92a in a downwardly protruding manner. The upper die 92 is configured so as not to contact with a portion of the pre-sealing glass 11 immediately above each LED element 2 and to contact with a periphery of the portion of the pre-sealing glass 11 immediately above the LED element 2. The upper die 92 is formed of, e.g., stainless or tungsten carbide, etc. In the present embodiment, the contact portion 92b of the upper die 92 is formed in a lattice shape, and contacts with a portion of the pre-sealing glass 11 intermediate between the adjacent LED elements 2.

FIG. 4A is an explanatory pattern diagram showing a state before the sealing process of the glass material.

Next, as shown in FIG. 4A, the pre-sealing glass 11 is deposited on a substantial flat mounting surface of the wiring board 3 so as to be arranged covering the LED element 2 (glass arrangement process). After this, pressure is applied on the lower die 91 and the upper die 92 for performing the hot pressing process on the glass material which is softened by heating in a nitrogen atmosphere. At this time, the pre-sealing glass 11 may be heated before or after the arrangement on the wiring board 3. The hot pressing process is performed by applying the pressure on the pre-sealing glass 11 from the upper die 92 in a direction of the wiring board 3. As a result, the pre-sealing glass 11 is fused on the wiring board 3 having the LED element 2 mounted thereon, and the LED element 2 is sealed by the pre-sealing glass 11 on the wiring board 3. Here, the hot pressing process only needs to be performed in an atmosphere which is inert to each member, and it may be performed in, e.g., vacuum other than the nitrogen atmosphere.

FIG. 4B is an explanatory pattern diagram showing a state during the sealing process of the glass material.

At this time, as shown in FIG. 4B, the pre-sealing glass 11 is partially dented by partially contacting and pressing the contact portion 92b of the upper die 92 into the pre-sealing glass 11 for deforming a portion of the upper surface not in contact with the upper die 92, thereby forming a curved surface on the upper surface (pressurizing process). In the present embodiment, the curved surface is formed on the entire upper surface of the pre-sealing glass 11, and is also formed in a portion immediately above each LED element 2.

In addition, in the pressurizing process, a concave portion 11a is formed between the adjacent curved surfaces of the upper surface of the pre-sealing glass 11 by the contact portion 92b. In the present embodiment, the size of the upper die 92 and the viscosity of the glass are set so that the shape of the concave portion 11a remains almost without changes even after the contact portion 92b of the upper die 92 is separated from the glass. Meanwhile, the concave portion 11a after separating the contact portion 92b of the upper die 92 from the glass can be made small by decreasing the size of the upper die 92 or reducing the viscosity than those of the present embodiment. Although the glass is formed in a state that the contact portion 92b is separated from the wiring board 3 in the present embodiment, the contact portion 92b may contact with the wiring board 3. Since the glass has relatively high viscosity at the time of forming the concave portion 11a in the pre-sealing glass 11, a curved surface, which is a middle of the pre-sealing glass 11 between the contact portions 92b swollen by pressing down the contact portion 92b sides, is formed on the non-contact portion of the pre-sealing glass 11 between the contact portions 92b. As a result, the upper surface 6a having the curved surface 6f, the side surface 6b extending downwardly from the outer edge of the upper surface 6a and the flat surface 6c horizontally extending from the lower edge of the side surface 6b are each formed on the glass sealing portion 6. A gas layer 93 is formed between the upper surface 6a of the glass sealing portion 6 and the main body 92a of the upper die 92.

An intermediate product 12 shown in FIG. 4B in a state that plural light-emitting devices 1 are coupled in a horizontal direction is made by the above-mentioned processes. After this, the wiring board 3 integrated with the glass sealing portion 6 is placed on a dicing apparatus, dicing is performed by entering a dicing blade into the concave portion 11a so as to divide the glass sealing portion 6 and the wiring board 3 per each LED element 2, thereby completing the light-emitting device 1 (dividing process).

FIG. 5 is a plan view showing a manufactured light-emitting device.

As shown in FIG. 5, the light-emitting device 1 has a square shape in a planar view, and the flat surface 6c is formed at an outer edge of the glass sealing portion 6. Since the pressure from the upper die 92 is directly applied on the flat surface 6c, the glass sealing portion 6 is relatively tightly bonded to the wiring board 3 at a lower side of the flat surface 6c.

In the light-emitting device 1 configured as mentioned above, when the voltage is applied to the LED element 2 through the circuit pattern 4, blue light is emitted from the LED element 2. The blue light emitted from the LED element 2 is radiated to outside through the upper surface 6a or the side surface 6b of the glass sealing portion 6. At this time, the upper surface 6a of the glass sealing portion 6 has the curved surface 6f which is convex upwards, so that light extraction efficiency is improved as compared to the case of a flat surface.

In addition, since the upper surface 6a of the glass sealing portion 6 is formed so as not to contact with the upper die 92, deformation off from a desired shape caused by the glass material adhered to the upper die 92 is not generated in the surface shape of the upper surface 6a. In addition, since the gas layer 93 is formed between the upper surface 6a and the upper die 92, even if a gas is generated from the glass material, etc., during the sealing, it is diffused into the gas layer 93. As a result, unlike the case that the upper surface 6a tightly contacts the upper die 92, deformation off from the desired shape, which is caused by gas entering between the upper surface 6a and the upper die 92, is not generated in the surface shape of the upper surface 6a. Therefore, the upper surface 6a of the glass sealing portion 6 can be formed into a desired shape to provide desired optical characteristics.

Furthermore, since the upper surface 6a of the glass sealing portion 6 does not contact with the upper die 92, it is possible to reduce surface roughness of the upper surface 6a as compared to the case of molding in contact with the die. Therefore, it is possible to simplify or omit mirror finish of the upper surface 6a after the sealing process, thereby reducing the manufacturing cost.

Moreover, since the dicing is performed by entering the dicing blade into the concave portion 11a of the pre-sealing glass 11, it is possible to reduce the surface roughness of the side surface 6b as compared to the case that the side surface 6b of the glass sealing portion 6 is formed by the dicing blade. Furthermore, it is possible to minimize the glass which is trimmed at the time of dicing, and the yield is improved.

In addition, since the circuit pattern 4 is formed on the wiring board 3 after the baking of the ceramic, positional accuracy of the circuit pattern 4 can be improved, and the positional accuracy of the LED element 2 electrically connected to the circuit pattern 4 can be improved as well. As a result, it is possible to minimize a shift of a relative positional relation between each contact portion 92b of the upper die 92 and each circuit pattern 4 of the wiring board 3, thereby suppressing a shift of the LED element 2 of the light-emitting device 1 to be manufactured from of a center axis of the upper surface 6a of the glass sealing portion 6. When the accuracy is not required for the relative positional relation between the LED element 2 and the upper surface 6a of the glass sealing portion 6, the circuit pattern 4 may be formed before baking the ceramic of the wiring board 3.

In addition, since the $ZnO$—$B_2O_3$—$SiO_2$—$Nb_2O_5$—$Na_2O$—$Li_2O$-based thermal fusion glass is used as the glass sealing portion 6, the glass sealing portion 6 can have good stability and weather resistance. Therefore, even when the light-emitting device 1 is used for long term under the severe environment, etc., the deterioration of the glass sealing portion 6 is suppressed and it is thereby possible to effectively suppress a time-dependent decrease in the light extraction efficiency. Moreover, since the glass sealing portion 6 has a high refractive index and high permeability properties, it is possible to realize coexistence of high reliability and high luminous efficiency.

In addition, since the glass having the yielding point (At) lower than an epitaxial growth temperature of a semiconductor layer of the LED element 2 is used as the glass sealing portion 6, the LED element 2 is not damaged due to thermal damage during the hot pressing process and it is possible to process at a sufficiently low temperature with respect to a crystal growth temperature of the semiconductor layer. Since the LED element 2 is sealed by using the lattice-shaped upper die 92, it is possible to suppress the flow of the glass in a direction parallel to the surface of the wiring board 3 during the hot pressing process. Therefore, it is possible to seal the glass at uniform pressure between each lattice.

Moreover, since the thermal expansion coefficient of the wiring board 3 is equivalent to that of the glass sealing portion 6, an adhesion failure such as separation or cracks is less likely to occur even it becomes room temperature or a low temperature state after adhesion at high temperature. In addition, the glass has generally characteristics in that the thermal expansion coefficient is increased at a temperature higher than Tg point, and when the glass sealing is performed at the temperature higher than Tg point, it is desirable to consider not only the thermal expansion coefficient at a temperature lower than Tg point but also that at a temperature higher than Tg point for performing the stable glass sealing. In other words, an internal stress causing warpage on the wiring board 3 can be reduced in the glass material composing the glass sealing portion 6 by determining the thermal expansion coefficient equivalent to the thermal expansion coefficient including the thermal expansion coefficient at the above-mentioned temperature higher than Tg point and the thermal expansion coefficient of the wiring board 3, and it is thereby possible to prevent shear fracture of the glass from occurring even though adhesion of the wiring board 3 to the glass sealing portion 6 is obtained. Therefore, the wiring board 3 and the glass sealing portion 6 can be large in size and it is possible to increase the number per batch production. In addition, according to the confirmation by the inventors, neither separation nor cracking occurs in a 1000-cycle liquid phase thermal shock test between −40° C. and 100° C. Furthermore, when the tests for glass and a ceramic substrate were conducted by a combination of various thermal expansion coefficients for a basic confirmation of bonding a glass piece having a size of 5 mm×5 mm to the ceramic substrate, it was confirmed that it is possible to bond without occurrence of cracks when the thermal expansion coefficient ratio of the member having a lower coefficient of thermal expansion to the member having a higher coefficient of thermal expansion is not less than 0.85. The equivalent thermal expansion coefficient means a thermal expansion coefficient in the above range, although this depends upon the rigidity and size, etc., of the member.

Moreover, since the thermal expansion coefficient of the LED element 2 is equivalent to that of the glass sealing portion 6, the thermal expansion coefficients of the member including the wiring board 3 become equivalent thereto, the internal stress is extremely small even in the temperature difference of the high temperature process for the glass sealing from the room temperature, and it is thereby possible to obtain stable processability without occurrence of cracks. In addition, since the internal stress can be reduced, impact resistance is improved and it is possible to realize a glass sealing-type light-emitting device excellent in reliability.

Since the front surface pattern 41 of the wiring board 3 is drawn to the rear surface pattern 42 by the via pattern 43, it is possible to simplify the manufacturing process without requiring a special countermeasure for preventing the glass from entering an unnecessary portion or an electric terminal from being covered. In addition, since the sealing process of the plural LED elements 2 can be performed at one time using a plate-like pre-sealing glass 11, the plural light-emitting devices 1 can be easily mass-produced by dicer cutting. Note that, since the thermal fusion glass is processed in a high viscosity state, unlike for the resins, a sufficient countermeasure is not necessary for outflow of the sealing material, it is sufficient to allow the mass production without using the via hole as long as the external terminal is drawn to the rear surface.

Figure 6:
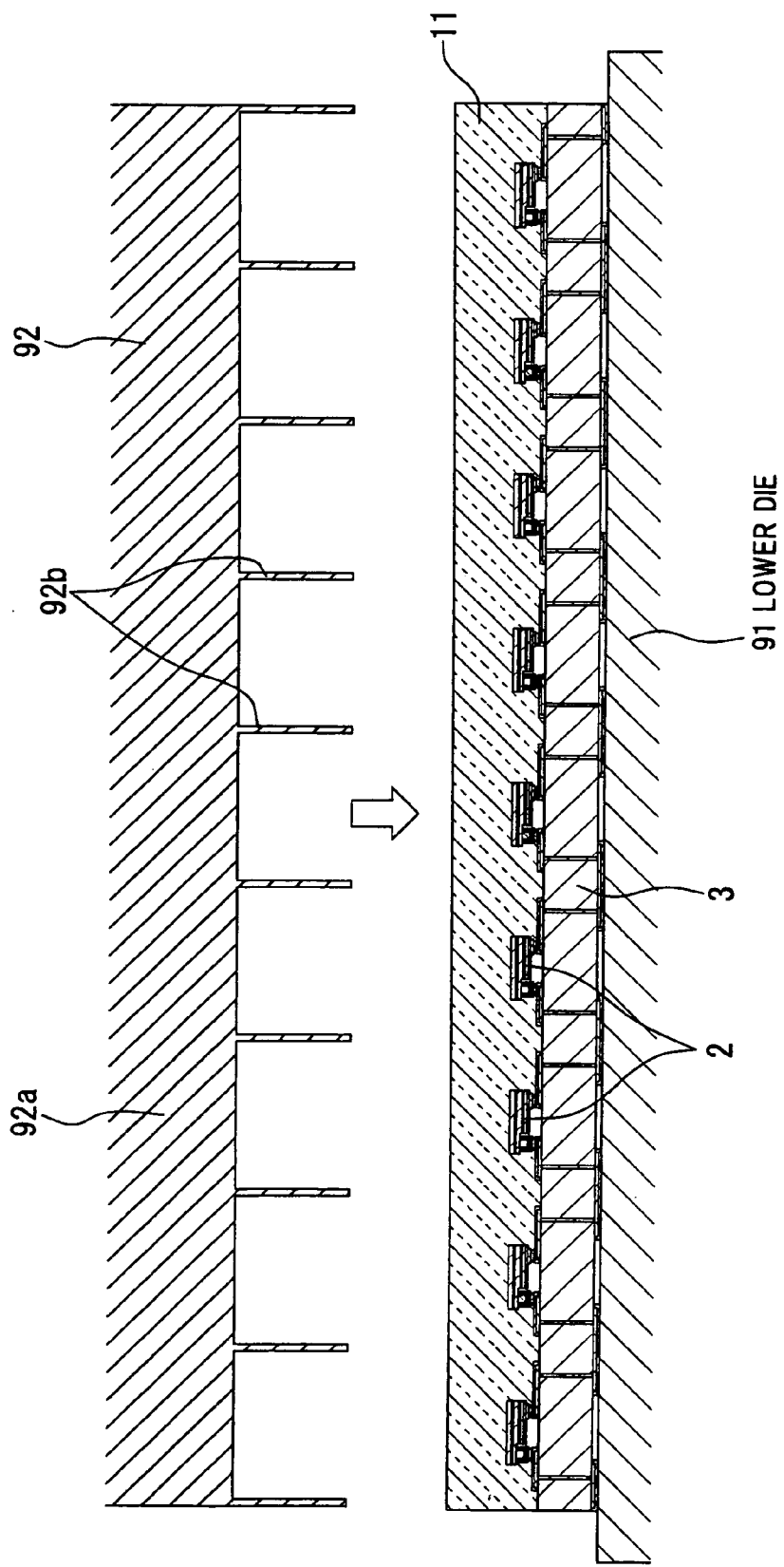
FIG. 6 is an explanatory pattern diagram showing a state after the sealing process of the glass material in a modification.

Although it is shown that the sealing of the LED element 2 and the formation of the curved surface of the upper surface 6a are simultaneously performed by using the lattice-shaped upper die 92 in the above-mentioned embodiment, the upper surface after the sealing of the LED element 2 may be curved by using separate dies, one for sealing and another for forming a curved surface. In other words, the formation of the curved surface is not limited to during the sealing by the glass material which is softened by heat, the curved surface may be formed during the processing of the glass material after the sealing. Although a shape of the glass at the time of sealing in this case is arbitrary, it is preferable that, for example, the LED element 2 on the wiring board 3 is sealed by using another die having a flat molding surface as shown in FIG. 6, and the upper surface of the glass is subsequently curved by the upper die 92.

Figure 7:
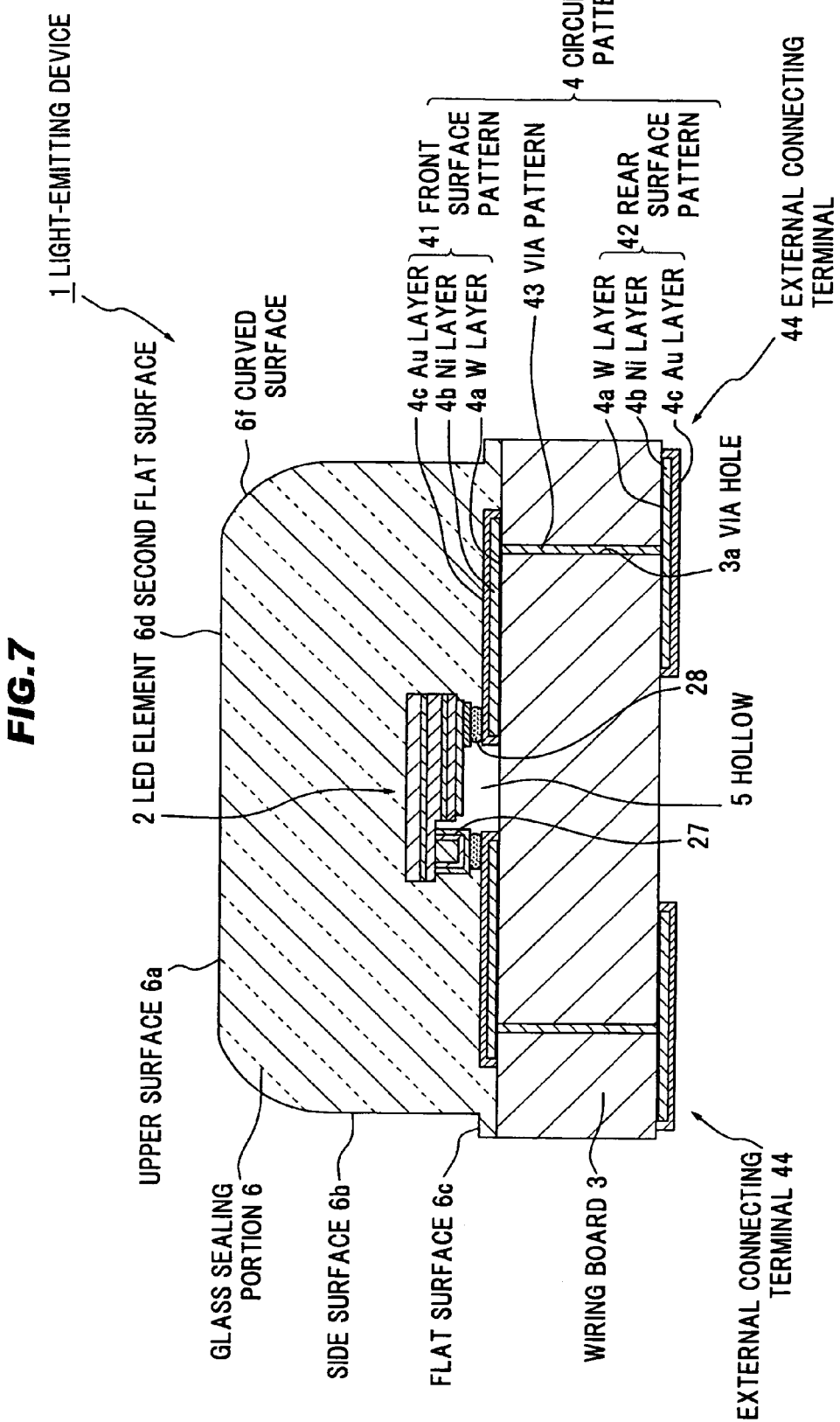
FIG. 7 is a schematic vertical cross sectional view showing the light-emitting device in the modification.

In addition, although it is shown that the curved surface is entirely formed on the upper surface 6a of the glass sealing portion 6 in the above-mentioned embodiment, for example as shown in FIG. 7, by adjusting the push-in amount of the upper die 92 or a size of the contact portion 92b, it is possible to form the curved surface 6f only on the side surface 6b side of the upper surface 6a and a second flat surface 6d in a portion of the upper surface 6a immediately above the LED element 2. It is preferable that the curved surface 6f is formed at a position at more than an angle where the upper surface 6a the side surface 6b of the glass sealing portion 6 makes a critical angle with respect to light directly reaching after emitted from the LED element 2. The effect of improving the light extraction efficiency is obtained by forming the curved surface 6f at such a position. Moreover, it is possible to reduce direction dependence of chromaticity by shortening the glass sealing portion 6 in a diagonal direction with respect to the LED element 2.

Figure 8:
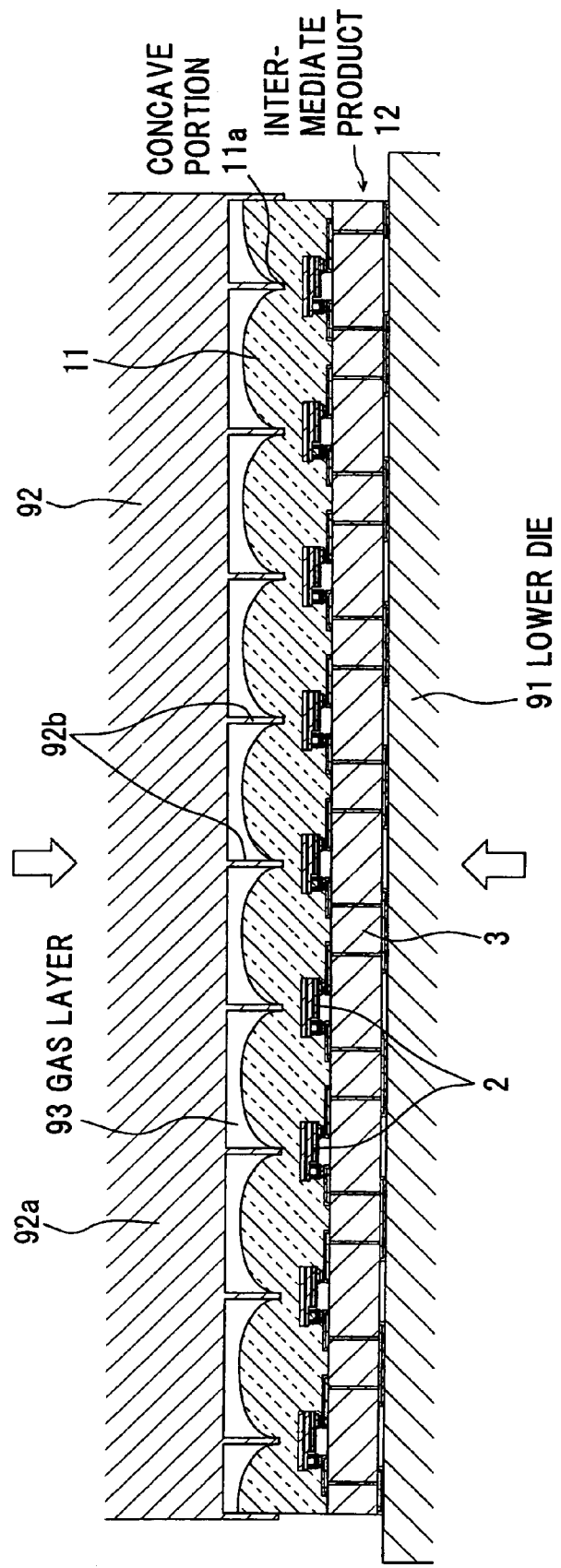
FIG. 8 is an explanatory pattern diagram showing a state during the sealing process of the glass material in the modification.
Figure 9:
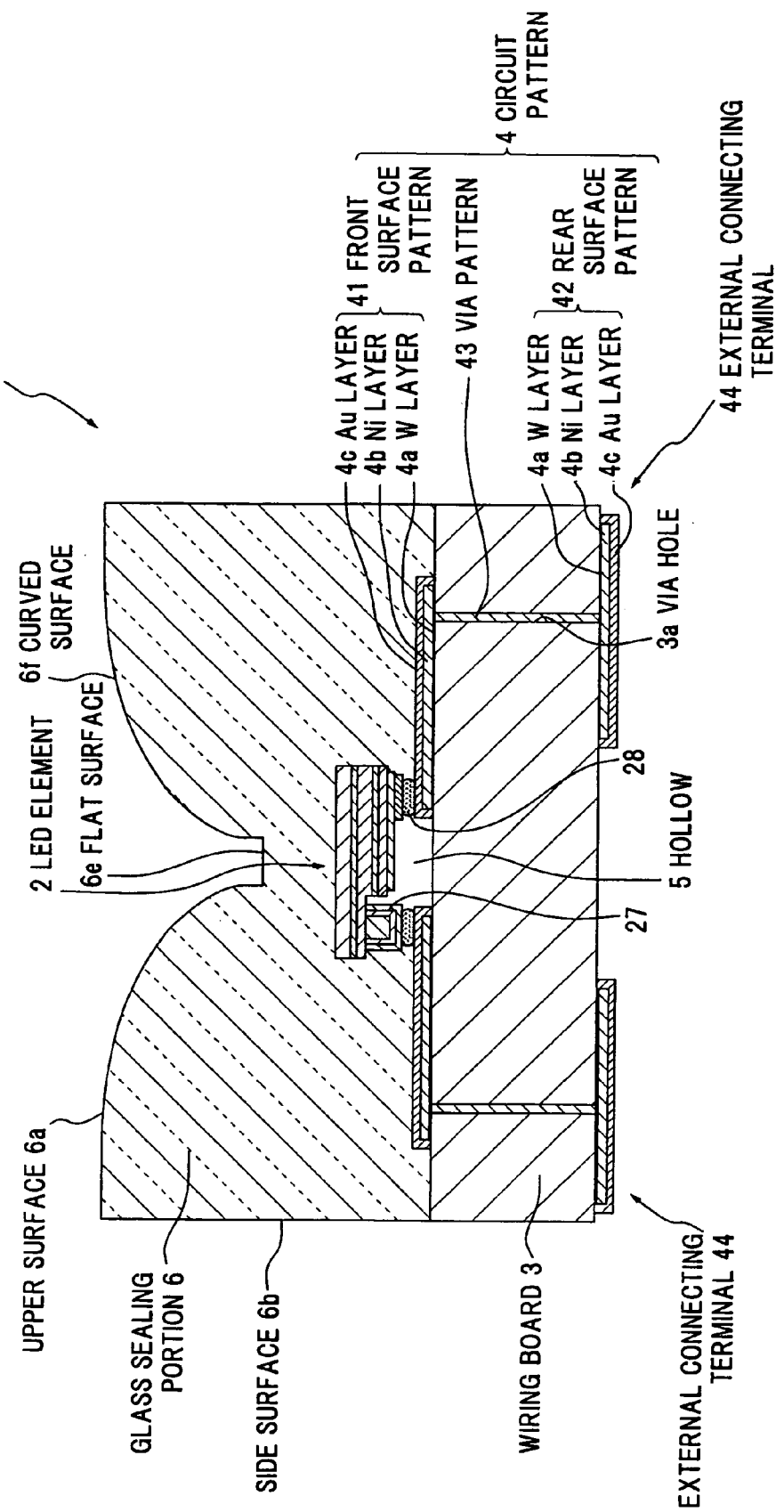
FIG. 9 is a schematic vertical cross sectional view showing the light-emitting device in the modification.

Alternatively, the curved surface 6f in which a portion of the upper surface 6a of the glass sealing portion 6 immediately above the LED element 2 is dented may be formed as shown in FIG. 9 by forming the concave portions 11a in a portion of the glass sealing portion 6 immediately above the LED element 2 as shown in FIG. 8 by pressing the upper die 92 thereinto. In FIG. 9, a flat surface 6e is formed on a portion immediately above the LED element 2 and the side surface 6b is formed flush with the wiring board 3. Alternatively, it is possible to have a shape without flat surface 6e by deforming the concave portion 11a so as to become small after separating the upper die 92 from the glass by decreasing a width size or reducing the viscosity of the glass. In this light-emitting device 1, the light radiated from the LED element 2 is reflected at the curved surface and the light is extracted mainly from the side surface 6b of the glass sealing portion 6.

Figure 10:
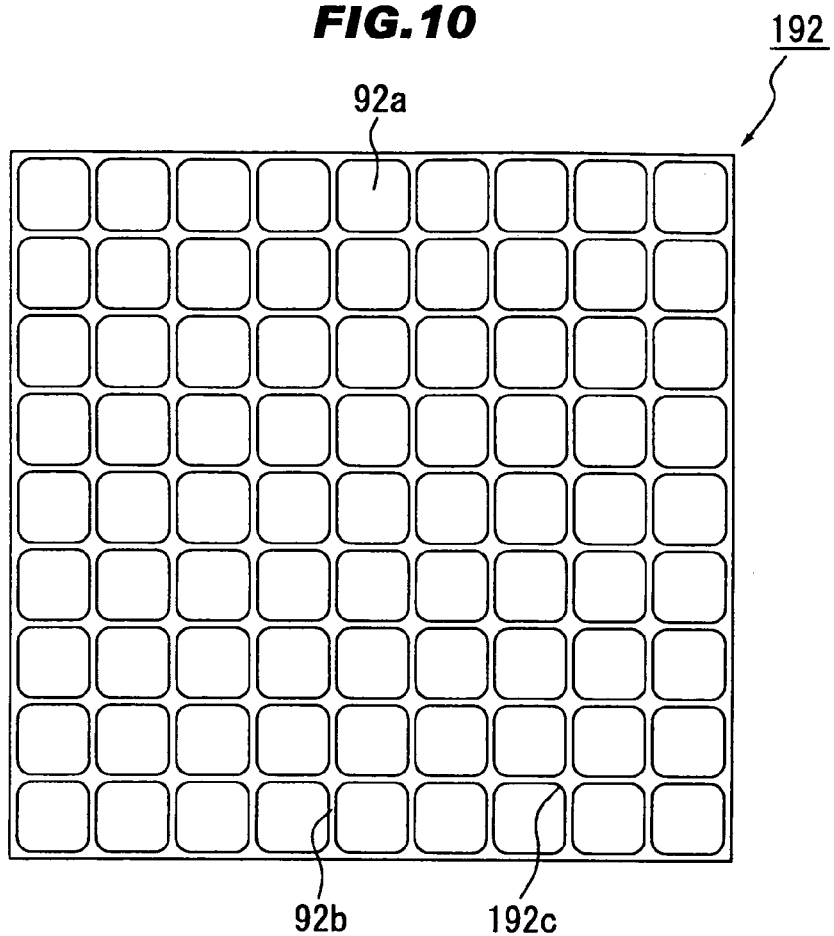
FIG. 10 is a bottom view of an upper die in the modification.

Instead of using the upper die 92 in the above-mentioned embodiment, for example, an upper die 192 in which corners of the lattice shape of the contact portion 92b are rounded as shown in FIG. 10 may be used. The contact portion 92b of the upper die 192 has chamfered portions 192c at intersections of horizontally extending linear portions. A light-emitting device 101 manufactured by using the upper die 192 is shown in FIG. 11.

Figure 11:
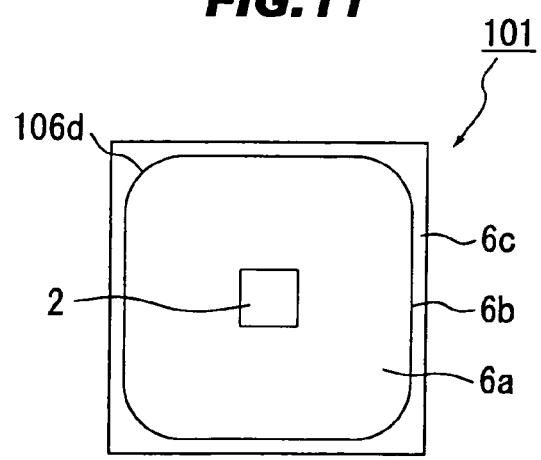
FIG. 11 is a plan view showing the light-emitting device in the modification.

As shown in FIG. 11, the light-emitting device 101 has chamfered portions 106d at corners of the side surface 6b of the glass sealing portion 6 in a planar view. As a result, the extraction efficiency to the outside of the device is improved also for the light horizontally radiated from the LED element 2. Although the size of the chamfered portion 106d is arbitrary, it is preferably determined so that the light radiated from an end portion of the LED element 2 does not become a critical angle at an interface between the glass sealing portion 6 and the external atmosphere.

Figure 12:
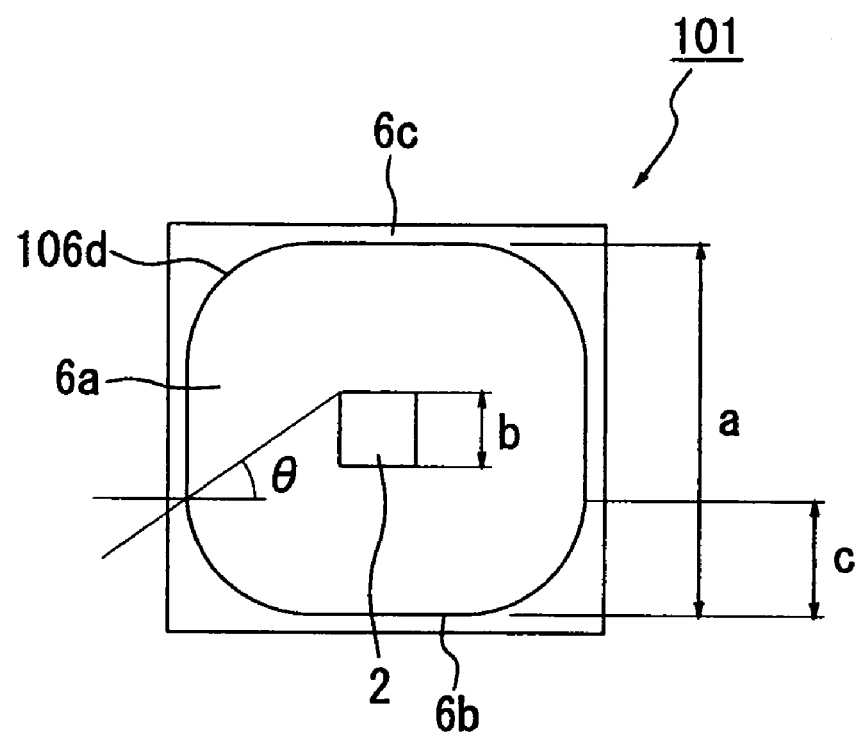
FIG. 12 is an explanatory view showing the light-emitting device in the modification.

In detail, in case that the chamfered portion 106d is in a circular arc shape, when, in a planer view, a distance between the opposing side surfaces 6b is defined as a, a length of one side of the LED element 2 is defined as b and a critical angle at an interface between the glass sealing portion 6 and the external atmosphere is defined as θ as shown in FIG. 12, a vertical and horizontal size c of a chamfered portion 106d is preferably $$c \geq a - (a-b) \cdot (1 + \tan \theta)/2.$$

Figure 13:
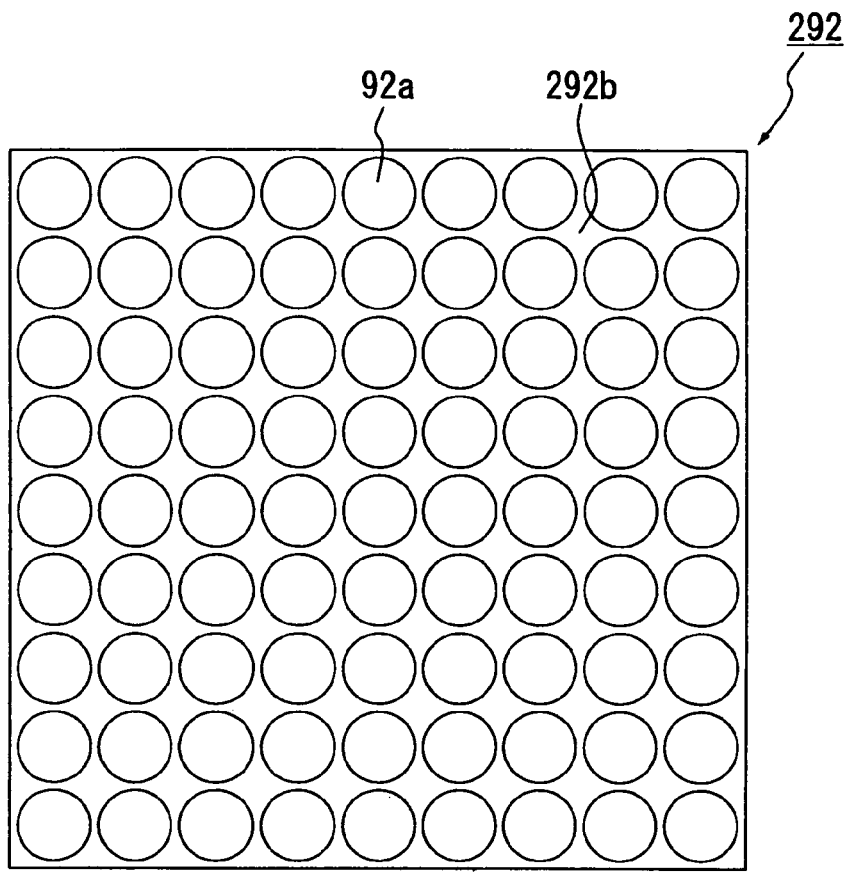
FIG. 13 is a bottom view of an upper die in the modification.
Figure 14:
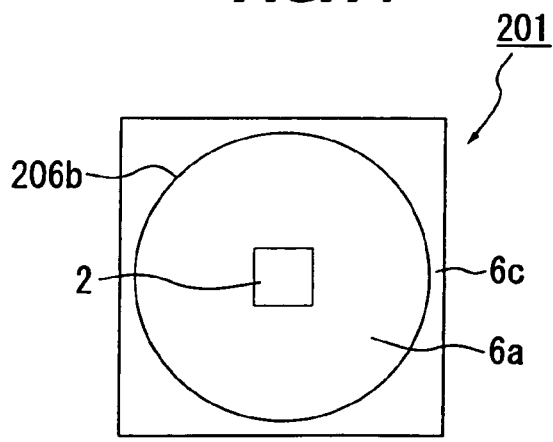
FIG. 14 is a plan view showing the light-emitting device in the modification.

Alternatively, instead of using the upper die 92 in the above-mentioned embodiment, for example, an upper die 292 having a contact portion 292b in a shape in which holes are vertically and horizontally arranged at equal intervals as shown in FIG. 13 may be used. A light-emitting device 201 manufactured by using the upper die 292 is shown in FIG. 14. As shown in FIG. 14, the glass sealing portion 6 of the light-emitting device 201 has a side surface 206b in a circle shape in a planer view.

Figure 15:
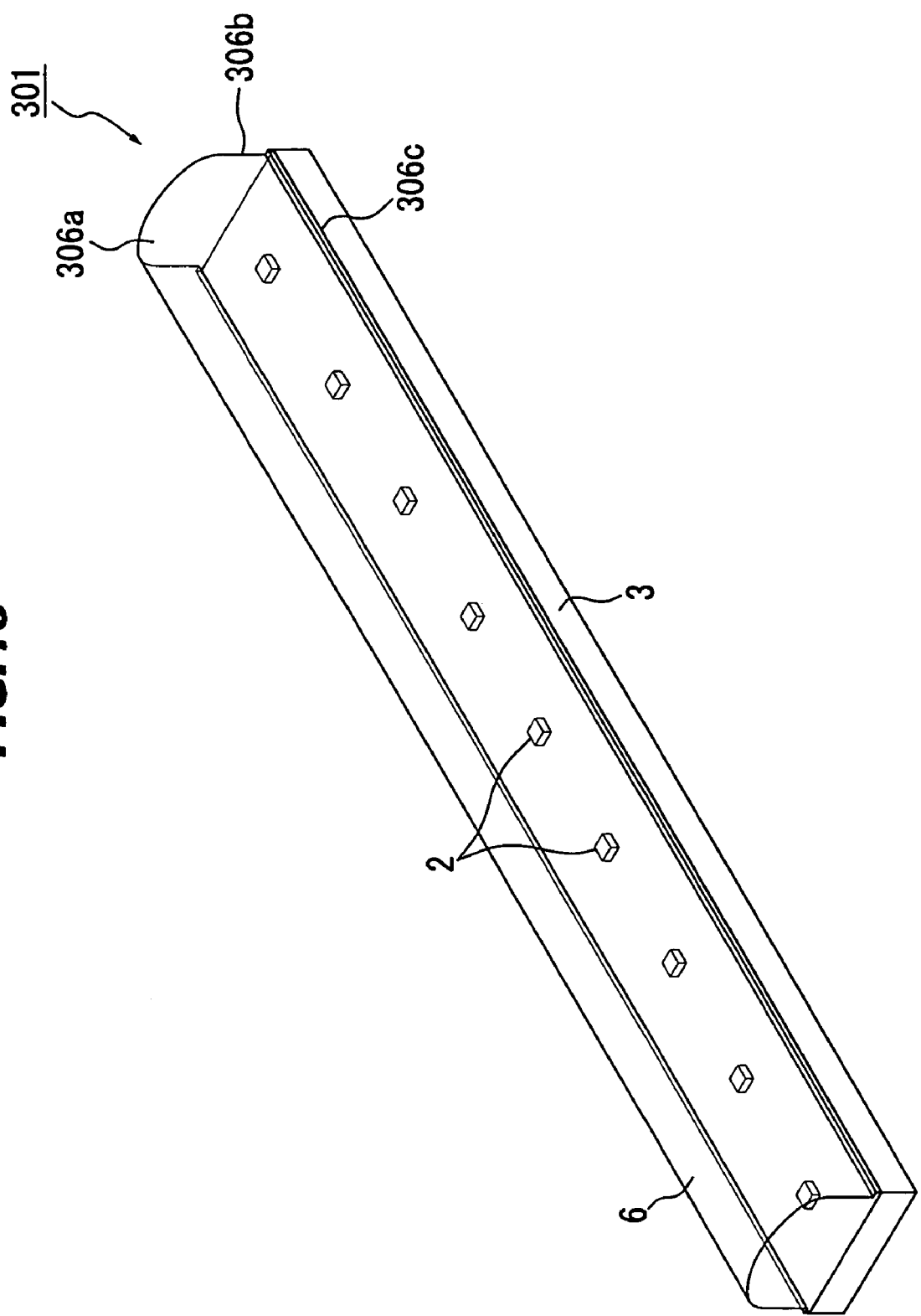
FIG. 15 is an outline perspective view showing the light-emitting device in the modification.

In addition, although it is shown that one LED element 2 is mounted on one light-emitting device 1 in the above-mentioned embodiment, for example, plural LED elements 2 may be mounted on one light-emitting device 301 as shown in FIG. 15. The light-emitting device 301 extends in a predetermined direction, and the plural LED elements 2 are mounted on a long wiring board 3 in a row. The glass sealing portion 6 is formed long along the wiring board 3 and has the same cross section in a longitudinal direction. The glass sealing portion 6 is formed so that an upper surface 306a curves in a width direction, that a side surface 306b extends downwardly from an outer edge of the width direction of the upper surface 306a, and that a flat surface 306c extends from a lower edge of the side surface 306b toward outside in the width direction.

Figure 16A:
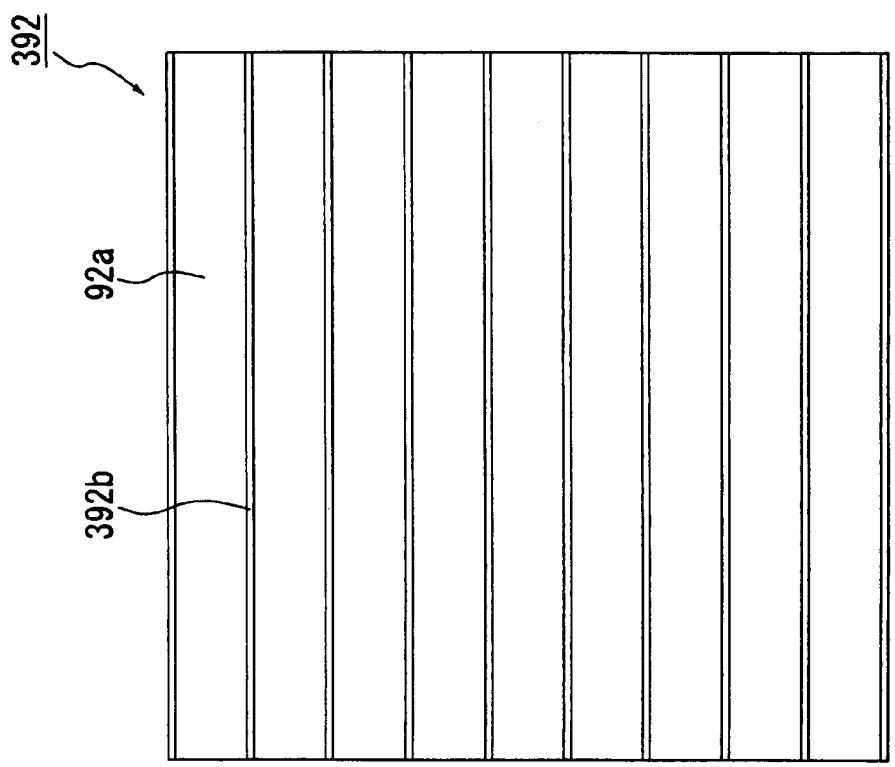
FIG. 16A is a plan view showing a wiring board having light-emitting elements mounted thereon.
Figure 16B:
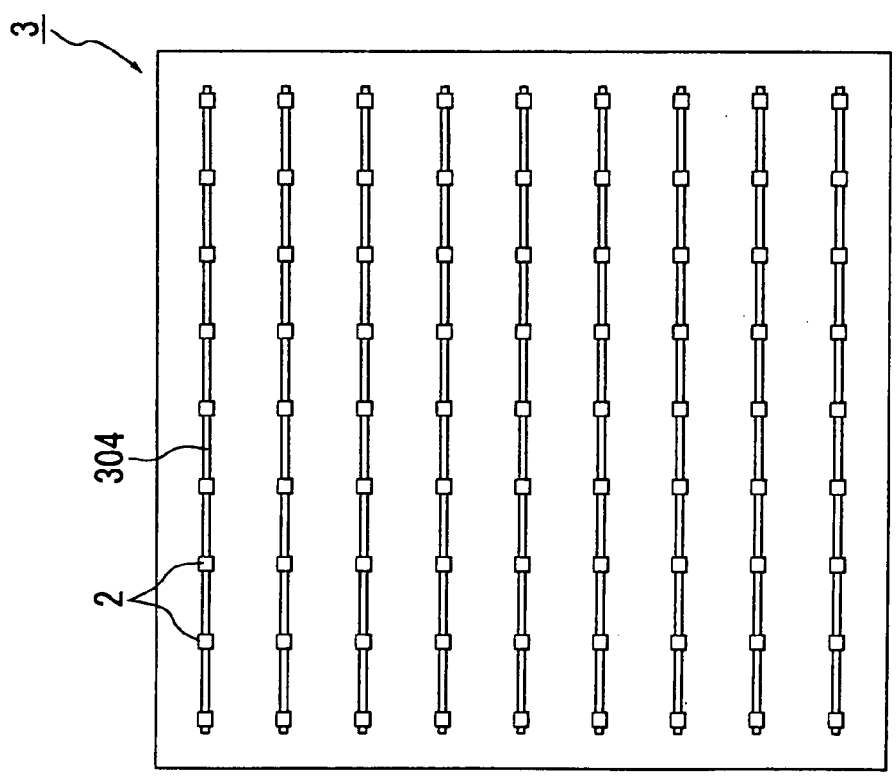
FIG. 16B is a bottom view of an upper die.

As shown in FIG. 16A, in the light-emitting device 301, the plural LED elements 2 are mounted on the wiring board 3 at equal intervals vertically and horizontally, and the LED elements 2 in a horizontal direction are electrically connected by a circuit pattern 304. Then, as shown in FIG. 16B, a contact portion 392b of an upper die 392 which is formed in a linear shape extending in a horizontal direction is brought into contact with the pre-sealing glass 11 so as to divide each LED element 2 in a vertical direction, and it is thereby possible to curve the upper surface 306a.

In addition, although the light-emitting device 1 using the LED element 2 formed of a GaN-based semiconductor is explained in the above-mentioned embodiment, the LED element is not limited to the GaN-based LED element 2. Hence, the light-emitting element may be formed of another semiconductor material such as, e.g., ZnSe-based or SiC-based material. In addition, an emission wavelength of the LED element 2 is also arbitrary, and the LED element 2 may emit green light, yellow light, orange light or red light, etc.

In addition, although the glass sealing portion 6 in the above-mentioned embodiment is excellent in weather resistance, the glass sealing portion 6 may be altered when dew condensation occurs depending on the use conditions, etc., of the device. For this problem, it is desirable to configure the device so that the dew condensation does not occur, however, it is possible to prevent the glass alteration due to the dew condensation in a high temperature condition by applying silicone resin coating to a surface of the glass sealing portion 6. Moreover, for a coating material applied to the surface of the glass sealing portion 6, for example, an inorganic material such as $SiO_2$-base or $Al_2O_3$-base is preferable as a material having not only moisture resistance but also resistance to acids and alkalis.

Furthermore, although it is shown that the pressure is applied on the wiring board 3 and the glass sealing portion 6 by the upper die 92 and the lower die 91 in the above-mentioned embodiment, it is possible to use the lower die 91 as a fixed member and to perform the glass sealing process only by the upper die 92.

In addition, the glass sealing portion 6 may include a phosphor which emits yellow light having a peak wavelength in a yellow region when excited by blue light emitted from the MQW layer 23. YAG (Yttrium Aluminum Garnet) phosphor, silicate phosphor or a mixture thereof mixed at a predetermined ratio, etc., can be used as the phosphor. In this case, a portion of the blue light emitted from the LED element 2 is converted into the yellow light by the phosphor in the glass sealing portion 6, and is radiated outside from the glass sealing portion 6 without wavelength conversion of the remaining portion. Thus, the light radiated from the glass sealing portion 6 has peak wavelengths in a yellow region as well as in a blue region, and as a result, white light is radiated outside of the device. Alternatively, it may be configured to obtain the white light by a combination of a LED element emitting ultraviolet light with a blue phosphor, a green phosphor or a red phosphor.

Figure 17:
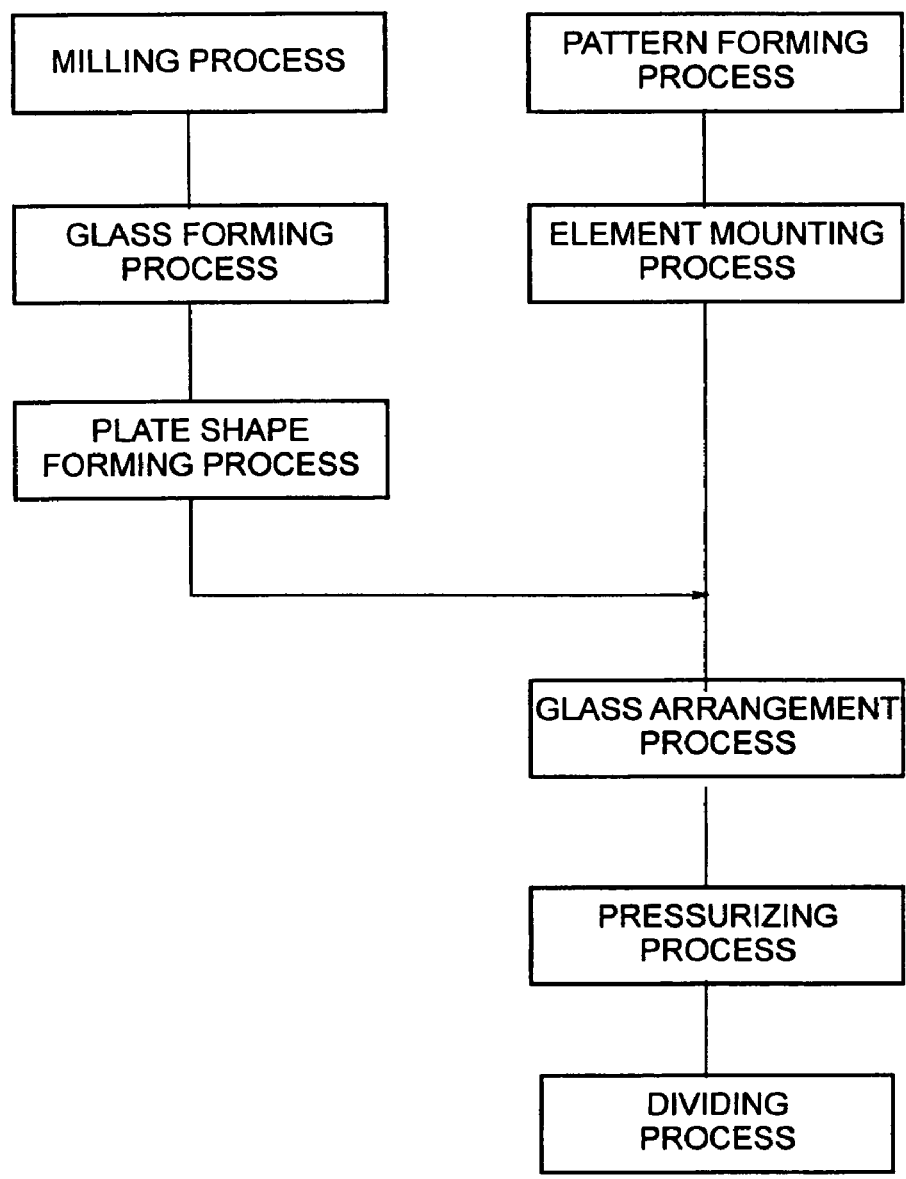
FIG. 17 is a process-explanatory diagram showing the method of manufacturing the light-emitting device.

The method of manufacturing the light-emitting device 1 containing a phosphor in the glass sealing portion 6 as described above will be explained hereinafter in conjunction with the process-explanatory diagram of FIG. 17.

Firstly, the $ZnO$—$B_2O_3$—$SiO_2$—$Nb_2O_5$—$Na_2O$—$Li_2O$-based thermal fusion glass is pulverized and particles of the yellow phosphor formed of, e.g., YAG is mixed thereto, thereby producing glass powder 10 in which the phosphor particles are uniformly dispersed in glass powder (pulverizing process).

Figure 18A:
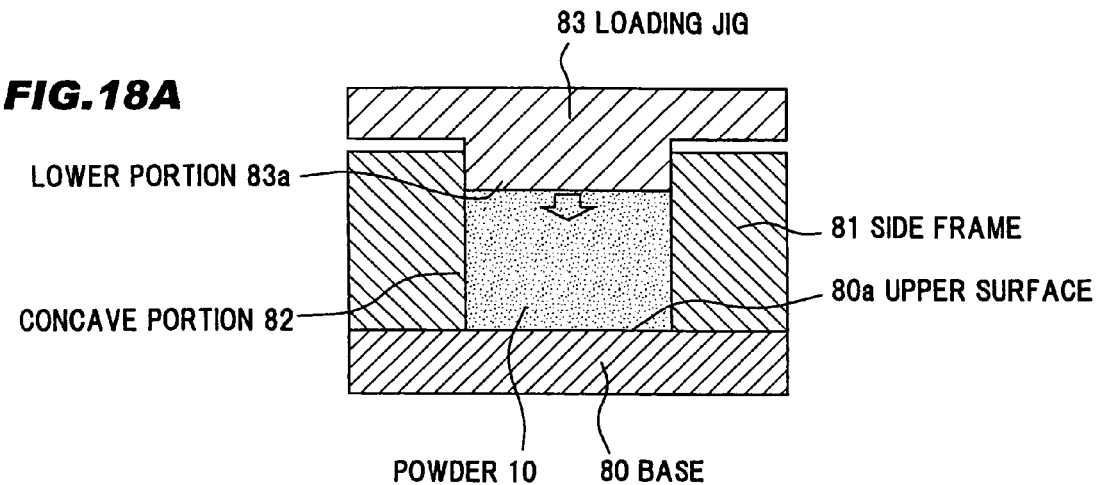
Figure 18B:
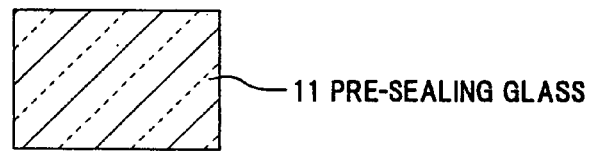
Figure 18C:
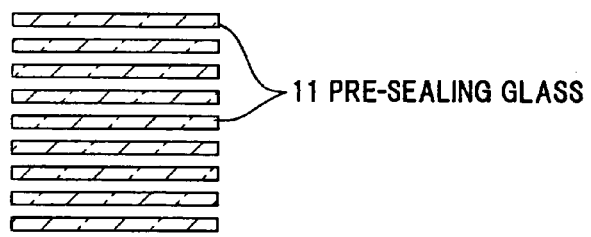

FIGS. 18A-C are explanatory views showing a processed state of an pre-sealing glass, wherein FIG. 18A shows a processing unit for producing the pre-sealing glass from glass powder, FIG. 18B shows the pre-sealing glass produced from the glass powder, and FIG. 18C shows a state that the obtained pre-sealing glass is sliced.

After the glass powder 10 produced in the pulverizing process is molten while applying load, an pre-sealing glass 11 is produced by solidifying the glass powder 10 (glass forming process). In detail, as shown in FIG. 18A, a cylindrical side frame 81 surrounding a predetermined region on a base 80 is provided on a flat upper surface 80a of the base 80 for forming a concave portion 82 opening upward. The concave portion 82 has the same cross section vertically throughout, meanwhile a lower portion 83a of a loading jig 83 formed corresponding to a cross sectional shape of the concave portion 82 is vertically movable in the concave portion 82. After introducing the glass powder 10 into the concave portion 82, the loading jig 83 for applying the pressure to the inside of the concave portion 82 is set. Then, the pressure of the ambient air is reduced to 7.6 Torr, the ambient air is heated to 650° C. and the pressure of 20 $kg/cm^2$ is applied to the glass powder 10 using the loading jig 83, thereby fusing the glass powder 10.

After this, the fused glass powder 10 is solidified by cooling, and it is thereby possible to obtain the pre-sealing glass 11 as shown in FIG. 18B. The produced pre-sealing glass 11 is sliced so as to correspond to the thickness of the glass sealing portion 6 and is shaped into a plate shape as s shown in FIG. 18C (plate shape forming process). In the present embodiment, the thickness of the glass sealing portion 6 is 0.5 mm. After this, the light-emitting device 1 is manufactured through the pattern forming process, the element mounting process, the glass arrangement process, the pressurizing process and the dividing process in the same manner as the aforementioned embodiment.

Furthermore, the glass sealing portion 6 may contain a diffusing particle. As the diffusing particle, for example, zirconia particle, alumina particle or silica particle, etc., can be used. The material of the diffusing particle is arbitrary, however, a white material is preferable from a viewpoint of permeability, and the fusing point is preferably higher than a temperature during the processing from a viewpoint of stability during the glass processing.

Alternatively, in the glass sealing portion 6 of the above-mentioned embodiment, the refractive index of the thermal fusion glass may be further increased by using $Bi_2O_3$ as a part of the $B_2O_3$—$SiO_2$—$Li_2O$—$Na_2O$—$ZnO$—$Nb_2O_5$-based thermal fusion glass. The refractive index of a ZnO composition in the thermal fusion glass is preferably 1.8. In addition, when the thermal fusion glass having the refractive index of 1.8 is used, it is preferable to use a light-emitting element in which the refractive index of the substrate (nd) is 1.8 or more since it is possible to improve the luminous efficiency by improving the efficiency of the light extraction from the light-emitting element. The light-emitting element in which the refractive index (nd) of the substrate is 1.8 or more includes a light-emitting element in which a GaN-based semiconductor is formed on, e.g., a $Ga_2O_3$ substrate, a GaN substrate or a SiC substrate, etc.

Alternatively, although it is shown that the wiring board 3 as a mounting portion is formed of alumina ($Al_2O_3$) in the above-mentioned embodiment, it may be formed of ceramic other than alumina. Furthermore, the mounting portion may be, of course, a metallic lead frame. Here, as a ceramic substrate formed of a highly heat-conductive material which is more excellent in heat resistance than alumina, for example, BeO (thermal expansion coefficient α: $7.6\times10^{-6}/°$ C., heat conductivity: 250 W/(m.k)) may be used. It is possible to obtain good sealing properties by the pre-sealing glass also in the substrate formed of BeO.

Furthermore, for example, a W—Cu substrate may be formed as another highly heat-conductive material. By using a W90-Cu10 substrate (thermal expansion coefficient α: $6.5\times10^{-6}/°$ C., heat conductivity: 180 W/(m.k)) or a W85-Cu15 substrate (thermal expansion coefficient α: $7.2\times10^{-6}/°$ C., heat conductivity: 190 W/(m.k)) as the W—Cu substrate, it is possible to impart high heat conductivity while ensuring good bond strength to the glass sealing portion, and it is thereby possible to easily deal with a large amount of light and high output of the LED.

In addition, although a light-emitting device using a LED element as a light-emitting element is explained in the above-mentioned embodiment, the light-emitting element is not limited to the LED element. In addition, although it is shown that the intermediate product 12 is made and divided for obtaining plural light-emitting devices 1 at the same time in the above-mentioned embodiment, the sealing process may be performed for each light-emitting device 1. In addition, the lower die 91 is not necessarily required, the die may be only the upper die 92, and other specific detailed structure, etc., can be, of course, appropriately changed.

Although the invention has been described with respect to the specific embodiment for complete and clear disclosure, the appended claims are not to be therefore limited but are to be construed as embodying all modifications and alternative constructions that may occur to one skilled in the art which fairly fall within the basic teaching herein set forth.

What is claimed is:

1. A method of manufacturing a light-emitting device, said method comprising, when sealing a light-emitting element on a mounting portion by a glass material softened by heating or when processing the glass material after the sealing, producing a concave portion partially on the glass material by partially contacting and pressing a die against an upper surface of the glass material such that a part of the upper surface being not in contact with the die is deformed and forms a curved surface.

2. The method according to claim 1, wherein the die is configured to be not in contact with a portion of the upper surface of the glass material directly above the light-emitting element, and is configured to be in contact with a periphery of the portion of the upper surface directly above the light-emitting element.

3. The method according to claim 2, wherein the curved surface is formed on the portion of the upper surface of the glass material directly above the light-emitting element.

4. The method according to claim 3, wherein a plurality of the light-emitting elements are mounted on the mounting portion, and the die contacts the upper surface of the glass material at a middle part between two adjacent light-emitting elements.

5. The method according to claim 4, wherein, after the glass material with the curved surface formed thereon is hardened, a dicing blade enters into the concave portion of the glass material for dividing the glass material and the mounting portion.

6. The method according to claim 5, wherein the die comprises a lattice contact portion for contacting the glass material.

7. A method of manufacturing a light-emitting device, said method comprising applying an upper die comprising a contact portion configured in a lattice shape to contact a portion of a presealing glass in an area intermediately between adjacent light emitting diode (LED) elements.

8. The method according to claim 7, wherein, during the applying the upper die, applying pressure to the pre-sealing glass from the upper die in a direction of a wiring board associated with the LED elements.

9. The method according to claim 7, wherein, during the applying the upper die, applying pressure to the pre-sealing glass from a lower die in a direction of a wiring board associated with the LED elements toward the upper die.

10. The method according to claim 7, further comprising softening the pre-sealing glass.

11. The method according to claim 7, wherein the applying the upper die comprises partially denting the pre-sealing glass to deform a portion of an upper surface of the pre-sealing glass not in contact with the upper die, to form a curved portion thereon.

12. The method according to claim 7, wherein internal corners of the lattice shape of the contact portion comprise a rounded shape.

13. The method according to claim 7, wherein an internal shape of the contact portion comprises a shape in which holes are vertically and horizontally arranged at equal intervals along the upper die.

14. The method according to claim 7, wherein the pre-sealing glass is formed over a wiring board, the LED elements being provided on the wiring board.

15. The method according to claim 7, further comprising forming a gas layer between an upper surface of the sealing glass and the upper die.

* * * * *